(12) United States Patent
Gilet et al.

(10) Patent No.: US 9,537,044 B2
(45) Date of Patent: Jan. 3, 2017

(54) OPTOELECTRIC DEVICE AND METHOD FOR MANUFACTURING THE SAME

(71) Applicants: ALEDIA, Grenoble (FR); COMMISSARIAT A L'ENERGIE ATOMIQUE ET AUX ENERGIES ALTERNATIVES, Paris (FR)

(72) Inventors: Philippe Gilet, Teche (FR); Xavier Hugon, Teche (FR); David Vaufrey, Grenoble (FR); Hubert Bono, Grenoble (FR); Bérangère Hyot, Eybens (FR)

(73) Assignees: ALEDIA, Grenoble (FR); Commissariat A L'Energie Atomique Et Aux Energies, Paris (FR)

( * ) Notice: Subject to any disclaimer, the term of this patent is extended or adjusted under 35 U.S.C. 154(b) by 0 days.

(21) Appl. No.: 14/438,188

(22) PCT Filed: Oct. 23, 2013

(86) PCT No.: PCT/EP2013/072448
§ 371 (c)(1),
(2) Date: Apr. 23, 2015

(87) PCT Pub. No.: WO2014/064276
PCT Pub. Date: May 1, 2014

(65) Prior Publication Data
US 2015/0280053 A1 Oct. 1, 2015

Related U.S. Application Data

(60) Provisional application No. 61/726,246, filed on Nov. 14, 2012.

(30) Foreign Application Priority Data

Oct. 26, 2012 (FR) .................................... 12 60208
Oct. 26, 2012 (FR) .................................... 12 60209
Oct. 26, 2012 (FR) .................................... 12 60232

(51) Int. Cl.
*H01L 33/00* (2010.01)
*H01L 31/18* (2006.01)
(Continued)

(52) U.S. Cl.
CPC ............. *H01L 33/007* (2013.01); *B82Y 40/00* (2013.01); *H01L 31/1804* (2013.01);
(Continued)

(58) Field of Classification Search
CPC ............... H01L 33/007; H01L 33/0054; H01L 31/1804; H01L 31/1852; H01L 33/18; H01L 33/08; H01L 33/24; H01L 21/28202; H01L 21/823462; H01L 29/518; H01L 21/3144; H01L 21/28185; H01L 21/28194; H01L 21/28556; H01L 21/3141; H01L 21/3185; H01L 21/823828; H01L 21/823857; H01L 21/02332; H01L 21/0234; H01L 21/02381; H01L 21/0254; H01L 21/02639; H01L 21/28088; H01L 21/31612; H01L 21/025458; H01L 21/02603; B82Y 40/00; B82Y 20/00; C23C 16/34
(Continued)

(56) References Cited

U.S. PATENT DOCUMENTS 7,829,443 B2 11/2010 Seifert et al.
2002/0117677 A1 8/2002 Okuyama et al.
(Continued)

FOREIGN PATENT DOCUMENTS

DE 10 2010 012711 A1 9/2011
EP 1246233 A2 2/2002
(Continued)

OTHER PUBLICATIONS

Chen X et al: "Homoepitaxial growth of catalyst-free GaN wires on N-polar substrates", Applied Physics Letters, AIP, American Institute of Physics, Melville, NY, US, vol. 97, No. 15, Oct. 13, 2010, 3 pages.
(Continued)

*Primary Examiner* — Caleen Sullivan
(74) *Attorney, Agent, or Firm* — Howard IP Law Group, P.C.

(57) ABSTRACT

A method for manufacturing an optoelectric device comprising a semiconductor substrate, pads on a surface of the substrate; semiconductor elements, each element being in
(Continued)

contact with a pad; and a dielectric region extending in the substrate from the surface and connecting, for each pair of pads, one of the pads in the pair to the other pad in the pair, the method successively comprising the forming of the pads and the forming of the region, wherein the region is formed by nitriding of the substrate, the method comprising the successive steps of: depositing a layer on the substrate; forming portions on the layer; etching the parts of the layer which are not covered with the portions to form the pads; removing the portions; and nitriding the pads and the parts of the substrate which are not covered with the pads, wherein the nitriding step successively comprises: a first step of nitriding of the pads at a first temperature; and a second step of nitriding of the parts of the substrate which are not covered with the pads at a second temperature different from the first temperature.

18 Claims, 7 Drawing Sheets

(51) Int. Cl.
| | | |
|---|---|---|
| *B82Y 40/00* | (2011.01) | |
| *H01L 33/18* | (2010.01) | |
| *H01L 33/08* | (2010.01) | |
| *H01L 33/24* | (2010.01) | |
| *B82Y 20/00* | (2011.01) | |

(52) U.S. Cl.
CPC ...... *H01L 31/1852* (2013.01); *H01L 33/0054* (2013.01); *H01L 33/18* (2013.01); *B82Y 20/00* (2013.01); *H01L 33/08* (2013.01); *H01L 33/24* (2013.01)

(58) Field of Classification Search
USPC .......................................................... 438/46
See application file for complete search history.

(56) References Cited

U.S. PATENT DOCUMENTS

| 2004/0132315 A1* | 7/2004 | Chambers ......... H01L 21/28185 |
| | | 438/763 |
| 2008/0233692 A1* | 9/2008 | Yu ..................... H01L 21/28202 |
| | | 438/197 |
| 2008/0261378 A1 | 10/2008 | Yao et al. |
| 2010/0096614 A1 | 4/2010 | Kim et al. |
| 2011/0079766 A1 | 4/2011 | Wildeson et al. |
| 2011/0140072 A1 | 6/2011 | Varangis et al. |
| 2012/0001303 A1 | 1/2012 | Huang et al. |
| 2012/0068153 A1 | 3/2012 | Seong et al. |

FOREIGN PATENT DOCUMENTS

| EP | 1796180 A1 | 6/2007 |
| EP | 2290710 A1 | 3/2011 |
| WO | 2010022064 A1 | 2/2010 |
| WO | 2009072631 A1 | 10/2012 |
| WO | 2012136665 A1 | 10/2012 |

OTHER PUBLICATIONS

Oliver, Mark H. et al., Organometallic vapor phase expitaxial growth of GaN on ZrN/AlN/Si substrates, Birk Nanotechnology Center, Applied Physics Letters, AIP, American Institute of Physics, Melville, NY, US, vol. 93, No. 15, 2008), pp. 1-5.

Song et al. Selective area growth of GaN nanowires using metalorganic chemical vapor deposition on nano-patterned Si (111) formed by the etching of nano-sized Au droplets. Thin Solid Films, 520(1), (2011) 126-130.

English Language translation of International Search Report dated Jan. 17, 2014 associated with counterpart PCT Application No. PCT/EP2013/072448.

Noborisaka, Jinichiro, Junichi Motohisa, and Takashi Fukui. "Catalyst-free growth of GaAs nanowires by selective-area metalorganic vapor-phase epitaxy." Applied Physics Letters 86.21 (2005): 213102, 3 pages.

* cited by examiner

OPTOELECTRIC DEVICE AND METHOD FOR MANUFACTURING THE SAME

CROSS REFERENCE TO RELATED APPLICATIONS

This application is the national stage application under 35 U.S.C. §371 of International Application No. PCT/EP2013/ 0072448 filed Oct. 25, 2013 with priority claim to French patent applications FR12/60208 filed Oct. 26, 2012, FR12/ 60209 filed Oct. 26, 2012, FR12/60232 filed Oct. 26, 2012, and U.S. Provisional Application No. 61/726,246 filed Nov. 14, 2012, the entire disclosures of which are incorporated herein by reference in their entireties.

BACKGROUND

The present disclosure generally relates to semiconductor materials, to devices based on semiconductor materials, and to their manufacturing methods. The present disclosure more specifically relates to devices comprising three-dimensional elements, and especially semiconductor microwires or nanowires.

DISCUSSION OF THE RELATED ART

Microwires or nanowires based on a component mainly containing a group-III element and a group-V element (for example, gallium nitride GaN), called III-V compound hereafter, or mainly containing a group-II element and a group-VI element (for example, zinc oxide ZnO), called II-VI compound hereafter, are examples of microwires or nanowires comprising a semiconductor material. Such microwires or nanowires enable to manufacture semiconductor devices such as optoelectric devices. Term "optoelectric devices" is used to designate devices capable of converting an electric signal into an electromagnetic radiation or the other way, and especially devices dedicated to the detection, the measurement, or the emission of an electromagnetic radiation or devices dedicated to photovoltaic applications.

Methods for manufacturing semiconductor material microwires or nanowires should enable to manufacture microwires or nanowires with an accurate and uniform control of the geometry, of the position, and of the crystallographic properties of each microwire or nanowire.

U.S. Pat. No. 7,829,443 describes a method for manufacturing nanowires, comprising the deposition of a layer of a dielectric material on a planar surface of a substrate, the etching of openings in the dielectric material layer to expose portions of the substrate, the filling of the openings with portions of a material promoting the growth of nanowires, and the forming of nanowires in the openings. The dielectric material is selected so that nanowires do not directly grow thereon.

In microwires or nanowires, to have the best possible properties of conversion of an electric signal into an electromagnetic radiation or of an electromagnetic radiation into an electric signal, it is desirable for each microwire or nanowire to substantially have a single-crystal structure. In particular, when the microwires or nanowires are mainly formed of a material based on a first element and on a second element, for example, III-V or II-VI compounds, it is desirable for each microwire or nanowire to substantially have a constant polarity all along the microwire or nanowire.

However, with the method disclosed in U.S. Pat. No. 7,829,443, the nanowire growth may be disturbed, so that each nanowire might not have a single-crystal structure. In particular, when the nanowires are mainly formed of a material based on a first element and on a second element, for example, III-V or II-VI compounds, a peripheral layer having a reverse polarity with respect to the polarity in the nanowire core may appear on the nanowire sides.

This may cause the forming of defects, especially at grain boundaries, which may alter the efficiency of the conversion of an electric signal into an electromagnetic radiation or the other way.

SUMMARY

Thus, an embodiment at least partly overcomes the previously described disadvantages of optoelectric devices, especially comprising microwires or nanowires, and of their previously described manufacturing methods.

Another embodiment provides, not to form three-dimensional elements, especially semiconductor material microwires or nanowires through openings made in a dielectric material layer.

Another embodiment provides that each three-dimensional element, especially each microwire or nanowire, made of semiconductor material, substantially has a single-crystal structure.

Another embodiment provides the possibility of accurately and uniformly controlling the position, the geometry, and the crystallographic properties of each three-dimensional element, especially of each microwire or nanowire, made of semiconductor material.

Another embodiment provides the possibility of forming the three-dimensional elements, and especially the microwires or nanowires, made of semiconductor material, at an industrial scale and at low cost.

Thus, an embodiment provides a method for manufacturing an optoelectric device comprising a semiconductor substrate; pads on a surface of the substrate; semiconductor elements, each element being in contact with a pad; and a dielectric region extending in the substrate from the above-mentioned surface and connecting, for each pair of pads, one of the pads in the pair to the other pad in the pair, the method successively comprising the forming of the pads and the forming of the region, wherein the region is formed by nitriding of the substrate, the method comprising the successive steps of:

depositing a layer on the substrate;
forming portions on the layer;
etching the parts of the layer which are not covered with the portions to form the pads;
removing the portions; and
nitriding the pads and the parts of the substrate which are not covered with the pads, wherein the nitriding step successively comprises:
a first step of nitriding of the pads at a first temperature; and
a second step of nitriding of the parts of the substrate which are not covered with the pads at a second temperature different from the first temperature.

According to an embodiment, the substrate comprises a first semiconductor material selected from the group comprising silicon, germanium, silicon carbide, a III-V compound, a II-VI compound, and a combination of these compounds.

According to an embodiment, the first semiconductor material is silicon.

According to an embodiment, each element comprises at least one portion mainly comprising a second semiconductor material in contact with one of the pads, the second semiconductor material being selected from the group comprising silicon, germanium, silicon carbide, a III-V compound, a II-VI compound, and a combination of these compounds.

According to an embodiment, the second semiconductor compound is a III-V compound, and especially a III-N compound.

According to an embodiment, the second semiconductor material is a III-V compound based on a first group-III element and on a second group-V element and each pad comprises a material promoting the growth of the compound according to the polarity of the second element selected form the group comprising aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride ($Mg_xN_y$), magnesium gallium nitride ($M_gGaN$), tungsten (W), tungsten nitride (WN), platinum (Pt), platinum nitride (PtN), and a combination thereof.

According to an embodiment, the above-mentioned region is made of an oxide of the semiconductor material forming the substrate.

According to an embodiment, the above-mentioned region is made of a nitride of the semiconductor material forming the substrate.

According to an embodiment, the thickness of each pad ranges between 1 nm and 100 nm.

According to an embodiment, the depth of the region ranges between 5 nm and 100 nm.

According to an embodiment, the substrate corresponds to a semiconductor layer covering a support, especially made of glass or metal.

According to an embodiment, the semiconductor substrate is in contact with each pad.

According to an embodiment, at least one of the elements is a microwire or a nanowire.

According to an embodiment, at least one of the elements is pyramid-shaped.

Another embodiment provides a method for manufacturing an optoelectronic device such as previously defined, successively comprising the forming of the pads and the forming of the region.

According to an embodiment, the region is formed by oxidation of the substrate.

According to an embodiment, the method comprises the successive steps of:
depositing a layer on the substrate;
forming insulating areas on the layer;
etching the parts of the layer which are not covered with the insulating areas to form the pads;
oxidizing the portions of the substrate which are not covered with the pads; and
removing the insulating areas.

According to an embodiment, the region is formed by nitriding of the substrate.

According to an embodiment, the method comprises the successive steps of:
depositing a layer on the substrate;
forming portions on the layer;
etching the portions of the layer which are not covered with the portions to form the pads; and
nitriding the portions of the substrate which are not covered with the pads, and possibly the pads.

According to an embodiment, the removal of the portions is performed between the etch step and the nitriding step.

According to an embodiment, the nitriding step successively comprises:
a first step of nitriding of the pads at a first temperature; and
a second step of nitriding of the portions of the substrate which are not covered with the pads at a second temperature strictly greater than the first temperature.

The foregoing and other features and advantages will be discussed in detail in the following non-limiting description of specific embodiments in connection with the accompanying drawings.

DETAILED DESCRIPTION

For clarity, the same elements have been designated with the same reference numerals in the different drawings and, further, as usual in the representation of electronic circuits, the various drawings are not to scale. Further, only those elements which are useful to the understanding of the present disclosure have been shown and will be described. In particular, the means for controlling the optoelectric devices described hereinafter are within the abilities of those skilled in the art and are not described.

In the following description, unless otherwise specified, terms "substantially", "approximately", and "approximately" mean "to within 10%". Further, "compound mainly formed of a material" or "compound based on a material" means that a compound comprises a proportion greater than or equal to 95% of the material, this proportion being preferentially greater than 99%.

The present disclosure relates to the manufacturing of three-dimensional elements, for example, of microwires, of nanowires, or of pyramid-shaped elements. In the following description, embodiments are described for the manufacturing of microwires or nanowires. However, such embodiments may be implemented for the manufacturing of three-dimensional elements other than microwires or nanowires, for example, for the manufacturing of three-dimensional pyramid-shaped elements.

Term "microwire" or "nanowire" designates a three-dimensional structure of elongated shape having at least two dimensions, called minor dimensions, ranging between 5 nm and 2.5 µm, their third dimension, called major dimension, being at least equal to 1 time the largest minor dimension, preferably equal to 5 times the above-mentioned dimension, and preferably still greater than 10 times this dimension. In certain embodiments, the minor dimensions may be smaller than or equal to approximately 1,000 nm, and preferably range between 100 nm and 300 nm. In certain embodiments, the height of each microwire or nanowire may be greater than or equal to 500 nm, and preferably ranges between 1 µm and 50 µm.

The cross-section of the microwires or nanowires may have different shapes such as, for example, a shape which may be oval, circular, or polygonal, especially triangular, rectangular, square, or hexagonal. Similarly, the microwires or nanowires may have a cylindrical, conical and/or tapered three-dimensional shape.

The microwires or nanowires may be at least partly formed from at least one semiconductor material. The semiconductor material may be silicon, germanium, silicon carbide, a III-V compound, a II-VI compound, or a combination of these compounds.

The microwires or nanowires may at least partly be formed of semiconductor materials mainly containing a III-V compound, for example, III-N compounds. Examples of group-Ill elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions.

The microwires or nanowires may be at least partly formed from semiconductor materials mainly comprising a II-VI compound. Examples of group-II elements comprise group-IIA elements, especially beryllium (Be) and magnesium (Mg) and group-IIB elements, especially zinc (Zn) and cadmium (Cd). Examples of group-VI elements comprise group-VIA elements, especially oxygen (O) and telluride (Te). Examples of II-VI compounds are ZnO, ZnMgO, CdZnO, or CdZnMgO. Generally, the elements in the II-VI compound may be combined with different molar fractions.

In certain embodiments, the microwires or nanowires may comprise a dopant. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C) or a group-IV N-type dopant comprising silicon (Si), germanium (Ge), selenium (Se), sulfur (S), terbium (Tb), and tin (Sn).

The microwires or nanowires are formed on a surface of a semiconductor material substrate. The substrate may correspond to a single-piece structure or correspond to a layer covering a support made of another material, for example, glass or metal. The substrate for example is a semiconductor substrate, such as a substrate made of silicon, germanium, silicon carbide, of a III-V compound, such as GaN or GaAs, of a II-VI compound, such as ZnO. Preferably, the substrate is made of silicon, specially single-crystal silicon or polysilicon.

The principle of embodiments of the present disclosure is to form, on a substrate surface, pads or islands, also called seed islands or nucleation islands hereafter, of a material promoting the growth of microwires or nanowires, and to then carry out a processing for protecting the surface of the substrate portions which are not covered by the seed islands, to form a dielectric region extending in the substrate from the substrate surface and connecting, for each pair of pads, one of the pads in the pair to the other pad in the pair, where the microwires or nanowires do not grow on the dielectric region. The dielectric region may be obtained by thermal oxidation of the substrate or by nitriding of the substrate.

Saying that a compound based on at least a first element and a second element has a polarity of the first element or a polarity of the second element means that the material grows along a privileged direction and that when the material is cut in a plane perpendicular to the privilege growth direction, the exposed surface essentially comprises atoms of the first element in the case of the polarity of the first element or atoms of the second element in the case of the polarity of the second element.

The material forming the seed islands is selected to promote the growth of the microwire or nanowire according to the same polarity. As an example, when the microwires or nanowires mainly comprise a III-V compound, the material forming the seed islands is preferably selected to promote the growth of the III-V compound according to the group-V element polarity. The III-V compound then grows according to the group-V element polarity on the seed islands, from the top of each seed island, and does not grow on the rest of the substrate. Further, the inventors have shown that each microwire or nanowire then grows according to a substantially constant polarity in the entire microwire or nanowire. When the microwires or nanowires mainly comprise a II-VI compound, the material forming the seed islands is preferably selected to promote the growth of the II-VI compound according to the group-VI element polarity. The II-VI compound then grows according to the group-VI element polarity on the seed islands, from the top of each seed island, and does not grow on the rest of the substrate.

In the case of a III-V compound where the group-V element is nitrogen, the material forming the islands may be a material promoting the growth of a microwire or nanowire according to the N polarity. As an example, the islands may be made of aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride in $Mg_xN_y$ form, where x is approximately equal to 3 and y is approximately equal to 2, for example $Mg_3N_2$ magnesium nitride, or magnesium gallium nitride (MgGaN), tungsten (W), tungsten nitride (WN), platinum (Pt), platinum nitride (PtN), or a combination thereof and of their nitrided compounds. Preferably, the material forming the seed islands is aluminum nitride.

The method for growing microwires or nanowires may be a method of metal-organic chemical vapor deposition (MOCVD) type, also known as organo-metallic vapor phase epitaxy (OMVPE). However, methods such as molecular beam epitaxy (MBE), gas source MBE (GSMBE), metal-organic MBE (MOMBE), atomic layer epitaxy (ALE), or hydride vapor phase epitaxy (HVPE) may be used.

As an example, the method may comprise injecting into a reactor a precursor of the group-III element and a precursor of the group-V element. Examples of group-III element precursors are trimethylgallium (TMG), triethylgallium (TEGa), trimethylindium (TMIn), or trimethylaluminum (TMAl). Examples of group-V element precursors are ammonia ($NH_3$), tertiarybutyl-phoshine (TBP), or arsine ($AsH_3$).

According to an embodiment, in a first phase of growth of the III-V compound microwires or nanowires, a precursor of an additional element is added in excess to the precursors of the III-V compound. The additional element may be silicon (Si). An example of silicon precursor is silane ($SiH_4$).

Figure 1A:
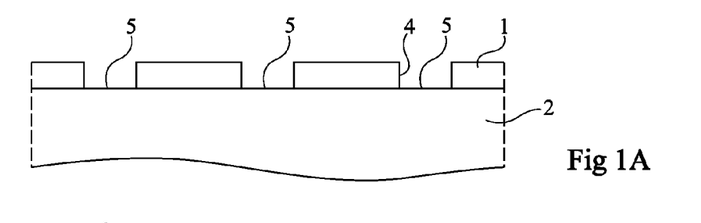
FIGS. 1A to 1C show a partial simplified cross-section views of the structures obtained at successive steps of a known method for manufacturing an optoelectronic device comprising microwires or nanowires.
Figure 1B:
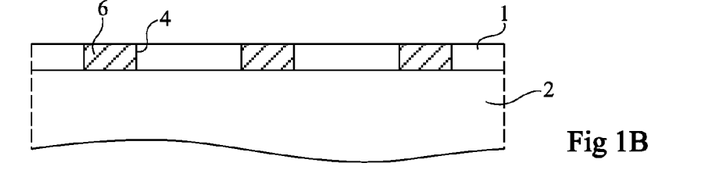
Figure 1C:
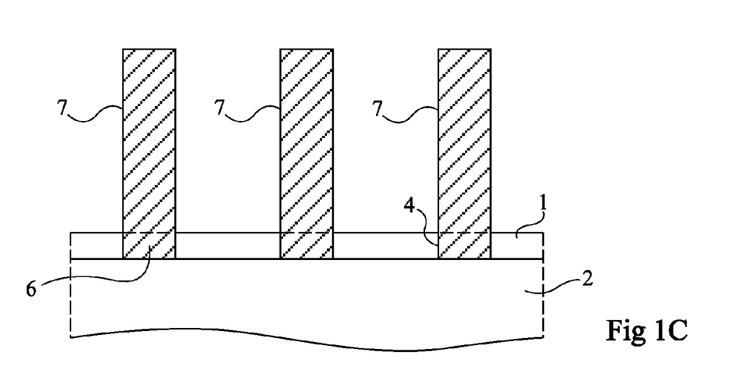

FIGS. 1A to 1C illustrate the structures obtained at successive steps of a known method for manufacturing an optoelectronic device comprising microwires or nanowires.

(i) A layer 1 of a dielectric material is deposited on a substrate 2 and openings 4 are etched in layer 1, openings 4 exposing certain portions 5 of substrate 2 (FIG. 1A).

(ii) Portions 6 of a material promoting the growth of microwires or nanowires are grown in openings 4 (FIG. 1B).

(iii) A microwire or nanowire 7 is grown on each portion 6 (FIG. 1C).

Figure 2:
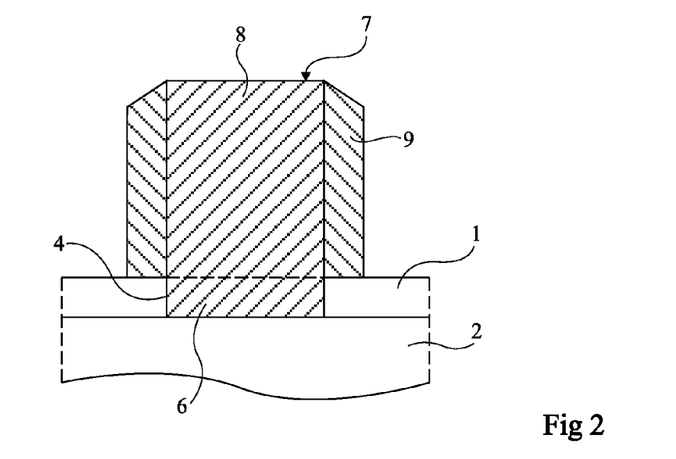
FIG. 2 is a partial simplified detail cross-section view of a microwire or nanowire obtained by the method described in relation with FIGS. 1A to 1C.

FIG. 2 is a detail view of one of microwires or nanowires 7 shown in FIG. 1C.

The inventors have shown that when the method previously described in relation with FIGS. 1A to 1C is implemented for the forming of microwires or nanowires of a semiconductor material based on a compound of a first element and of a second element, this results in the forming of a microwire or nanowire 7 comprising a single-crystal core 8 having the polarity of the first element, surrounded with a single-crystal peripheral layer 9 having the polarity of the second element. This may cause defects to appear at the interface between layer 9 and core 8.

An explanation would be that the presence of dielectric layer 1 disturbs the forming of portion 6 and/or the beginning of the growth of microwire or nanowire 7, which causes the forming of layer 9 when microwire or nanowire 7 grows from underlying portion 6.

Figure 3:
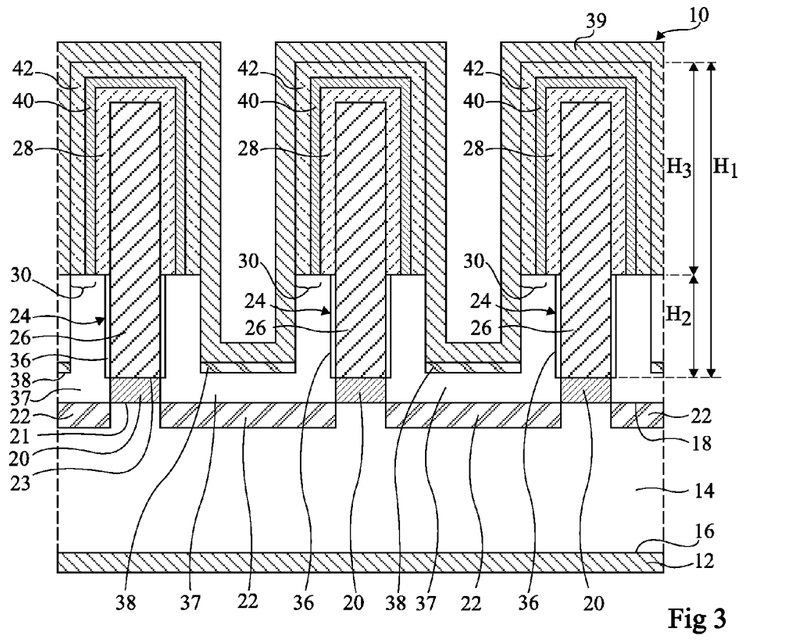
FIG. 3 is a partial simplified cross-section view of an embodiment of an optoelectric device comprising microwires or nanowires.

FIG. 3 is a partial simplified cross-section view of an embodiment of an optoelectric device 10 which is capable of emitting an electromagnetic radiation and for which each microwire or nanowire mainly comprises a III-N compound.

Device 10 comprises, from bottom to top in FIG. 3:
- a first polarization electrode 12;
- a semiconductor substrate 14 comprising opposite surfaces 16 and 18, surface 16 being in contact with electrode 12;
- seed islands 20 promoting the growth of nanowires or microwires and arranged on surface 18, each island 20 comprising a lower surface 21 in contact with surface 18 of substrate 14 and an upper surface 23, opposite to surface 21, and at a distance from surface 21;
- a region 22 in substrate 14, extending between each pair of islands 20 from surface 18 down to part of the depth of substrate 14, region 22 being formed of a dielectric, originating from the transformation of the substrate, which protects the underlying substrate and prevents the growth of microwires or nanowires;
- microwires or nanowires 24 (three microwires or nanowires being shown) of height H1, each microwire or nanowire 24 being in contact with surface 23 of one of islands 20, each microwire or nanowire 24 comprising a contact portion 26, in contact with island 20, an active portion 28 in contact with contact portion 26, and a polarization portion 30 in contact with active portion 28;
- a dielectric layer 36 covering a portion of the periphery of contact portion 26 of each microwire or nanowire 24 from the base of microwire or nanowire 24 in contact with the associated island 20;
- an insulating layer 37 covering, for each microwire or nanowire 24, a portion of microwire or nanowire 24 from the base of microwire or nanowire 24 in contact with island 20, to cover the edge of polarization portion 30;
- a reflective portion 38 covering insulating layer 37 between microwires or nanowires 24; and
- a second polarization electrode 39 in contact with each microwire or nanowire 24 at the level of polarization portion 30.

Substrate 14 for example is a semiconductor substrate such as a silicon substrate. Substrate 14 may be doped with a first conductivity type, for example, N-type doped. Surfaces 16 and 18 may be planar and parallel. Surface 18 of substrate 14 may be a <100> surface.

Electrode 12 may correspond to a conductive layer which extends on surface 16 of substrate 14. The material-forming electrode 12 may for example be nickel silicide (NiSi), aluminum (Al), aluminum silicide (AlSi), titanium (Ti), or titanium silicide (TiSi).

Islands 20 for example have a thickness ranging between 1 and 100 nanometers, and preferably ranging between 10 and 30 nanometers. Islands 20 are located on surface 18 so that they protrude from surface 18. Top 23 of each island 20 thus is in a different plane than surface 18. Each island 20 has a preferential texturing and, when the material forming each island comprises an alloy of at least two elements, a preferential polarity. "Preferential texturing" means that the crystals which form islands 20 have a privileged growth direction, which is the same for all islands 20. Term "preferential polarity" means that islands 20 all substantially have the same polarity. This means that when the material forming each island comprises an alloy of at least two elements, when the material is cut in a plane perpendicular to the privileged growth direction of the material, the exposed surface essentially comprises atoms of the same element for each island 20. Each island 20 may have the same conductivity type as substrate 14 to limit the interface resistance between islands 20 and substrate 14. Each island 20 has a shape corresponding to the cross-section desired for the associated microwire or nanowire 24. In the case where the three-dimensional element formed on each island is pyramid-shaped, each island 20 has a shape corresponding to the base desired for the pyramid-shaped element. As an example, each island 20 has a substantially hexagonal shape with an average diameter selected according to the desired average diameter of the associated microwire or nanowire 24. As a variation, each island 20 may have a rectangular, polygonal, circular, square, or oval shape.

Regions 22 may partly extend under islands 20. However, semiconductor substrate 14 should remain in electric contact with each island 20. The forming conditions of regions 22 are thus selected so that regions 22 extend at most along a length smaller than half the greatest length of the microwire and nanowire cross-section.

The centers of two adjacent islands 20 may be distant by from 0.5 μm to 5 μm and preferably from 1.5 to 3 μm. As an example, islands 20 may be regularly distributed on substrate 14, region 22 forming a grid surrounding each island 20. As an example, islands 20 may be distributed in a hexagonal network. Region 22 may partially extend under certain islands 20 or under each island 20.

Each microwire or nanowire 24 is a semiconductor structure elongated in a direction substantially perpendicular to surface 18. Each microwire or nanowire 24 may have a generally cylindrical elongated shape with a hexagonal base. The average diameter of each microwire or nanowire 24 may range between 50 nm and 2.5 µm and height H1 of each microwire or nanowire 24 may range between 1 µm and 50 µm.

Contact portion 26 of each microwire or nanowire 24 is mainly formed of the III-N compound, which may have the same conductivity type as substrate 14. The periphery of contact portion 26 is covered with dielectric layer 36 up to a height $H_2$ from the end of contact portion 26 in contact with the associated island 20. Height $H_2$ may range between 500 nm and 25 µm. The thickness of dielectric layer 36 for example ranges between one atomic monolayer and 5 nm.

For each microwire or nanowire 24, active portion 28 corresponds to a layer covering the end of contact portion 26 and extending on the fraction of contact portion 26 which is not covered with layer 36 on the side opposite to seed island 20.

Active portion 28 is at least partially made of a III-N compound, for example, gallium indium nitride. It may comprise a succession of layers made of III-N compounds. Active portion 28 may be doped with the first conductivity type, be undoped, or be doped with a second conductivity type opposite to the first conductivity type. Each active portion 28 forms a semiconductor junction with the corresponding contact portion 26. Active portion 28 may comprise confinement means, such as multiple quantum wells.

For each microwire or nanowire 24, polarization portion 30 may comprise a III-N material. Polarization portion 30 may have a conductivity of the second type. Polarization portion 30 may comprise an electron blocking layer 40, with a doping of the second conductivity type, made of aluminum gallium nitride (AlGaN), in contact with active portion 28, and an additional layer 42, for providing a good electric contact between second electrode 39 and active portion 28, for example, made of gallium nitride (GaN) in contact with electron-blocking layer 40 and with electrode 39. The portion of microwire or nanowire 24 comprising the fraction of contact portion 26 which is not covered with layer 36, active portion 28, and polarization portion 30, extends up to a height H3 which may range between 500 nm and 25 µm.

Insulating layer 37 is capable of preventing the forming of a direct electric contact between contact portion 26 of each microwire or nanowire 24 and electrode 39. Insulating layer 37 may be made of a dielectric material, for example silicon oxide ($SiO_2$), silicon nitride ($Si_xN_y$, where x is approximately equal to 3 and y is approximately equal to 4, for example, $Si_3N_4$), aluminum oxide ($Al_2O_3$), hafnium oxide ($HfO_2$), or diamond.

Reflective portion 38 is for example made of aluminum, silver, or ruthenium and for example has a thickness greater than 100 nm.

Second electrode 39 is capable of both polarizing polarization portion 30 of each microwire or nanowire 24 and letting through the electromagnetic radiation emitted by microwires or nanowires 24. The material-forming electrode 39 may be a semi-transparent material such as indium-tin oxide (ITO) or aluminum-doped zinc oxide.

In the present embodiment, microwires or nanowires 24 are formed on islands 20 which are separate elements distributed on substrate 14. If the microwires or nanowires were formed on a layer covering substrate 14, the fact for the layer and substrate 14 to be made of different materials having different thermal expansion coefficients would create mechanical stress in the optoelectronic device during the manufacturing thereof. The present embodiment advantageously enables to avoid the appearing of mechanical stress in islands 20 and substrate 14 due to the difference in thermal expansion coefficients between the materials forming islands 20 and substrate 14.

FIGS. 4A to 4I illustrate the structures obtained at successive steps of an embodiment of a method for manufacturing optoelectric device 10 of FIG. 3.

Figure 4A:
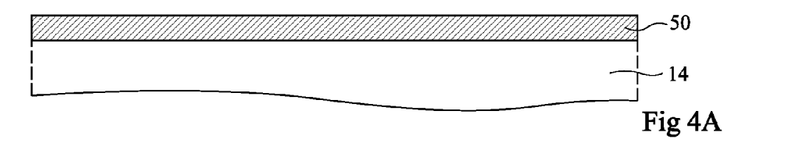
FIGS. 4A to 4I are partial simplified cross-section views of the structures obtained at successive steps of an embodiment of a method for manufacturing the optoelectric device of FIG. 3.
Figure 4B:
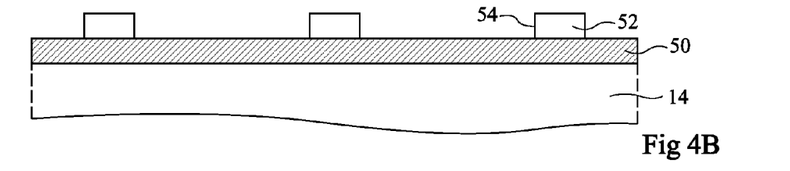

An embodiment of the manufacturing method comprises the steps of:

(1) Depositing on substrate 14 a uniform layer 50 of the material promoting the growth of the III-N compound, for example, according to the N polarity (FIG. 4A). It may be aluminum nitride. Layer 50 for example has a thickness ranging between 1 nm and 100 nm, preferably between 1 nm and 50 nm. Layer 50 may be obtained by an MOCVD-type method. However, methods such as CVD, MBE, GSMBE, MOMBE, ALE, HVPE, ALD (Atomic Layer Deposition) or reactive cathode sputtering may be used, as well as any type of deposition enabling to obtain a textured layer. When layer 50 is made of aluminum nitride, layer 50 should be substantially textured and have a preferential polarity.

(2) Deposition of a dielectric material layer on layer 50 and etching of openings 54 in the dielectric layer to expose areas of layer 50 (FIG. 4B) and form portions 52 of the dielectric layer. Portions 52 are made of a dielectric material which may be etched selectively over the dielectric material forming regions 22. The dielectric material for example is silicon nitride (for example, Si3N4). Dielectric layer 52 for example has a thickness ranging between 50 and 200 nm, for example, approximately 100 nm.

Figure 4C:
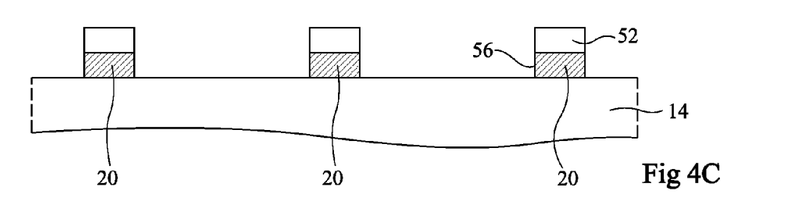

(3) Etching of openings 56 in layer 50 to form islands 20 (FIG. 4C). It may be a dry or wet etching, stopping on substrate 14. As an example, openings 56 may be etched by RIE (Reactive Ion Etching), ICP (inductively coupled plasma) etching, or wet etching.

Figure 4D:
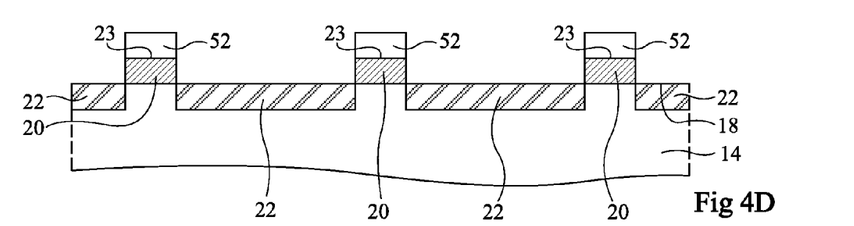

(4) Forming of region 22 by a method of thermal oxidation of the exposed areas of substrate 14 (FIG. 4D). Region 22 is essentially made of silicon dioxide ($SiO_2$). The obtained silicon oxide depth should be sufficient to prevent any etching of the group-III element, for example, gallium, against the material forming substrate 14. The depth of region 22 may range between 5 nm and 100 nm, and may preferably be greater than or equal to 10 nm. Region 22 may be formed in a high-temperature furnace. The oxidation step may be performed with oxygen or with water vapor. As an example, the oxidation temperature varies by from 750 to 1,100° C. for oxidation times varying from a few minutes to one hour. During the step of forming of region 22, portions 52 protect top 23 of each island 20 against the oxidation processing. Region 22 may partly extend under islands 20. The oxidation conditions are selected so that substrate 14 however remains in electric contact with each island 20. Further, an overthickness may appear at the level of region 22.

Figure 4E:
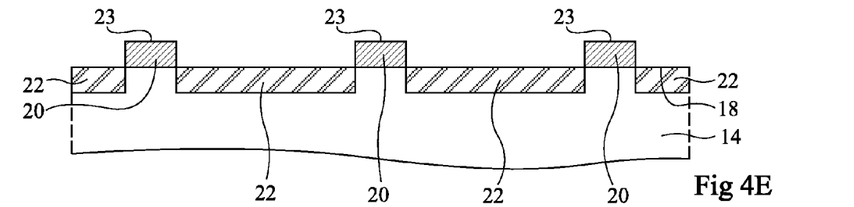

(5) Removal of portions 52 of the dielectric layer (FIG. 4E). This may be performed by a selective etch step which causes no etching of pads 20 and of regions 22. It may be an etching using a sulfur hexafluoride plasma (SF6).

(6) Growth of a fraction of contact portion 26 of each microwire or nanowire 24 (FIG. 4F) up to height H2.

Figure 4F:
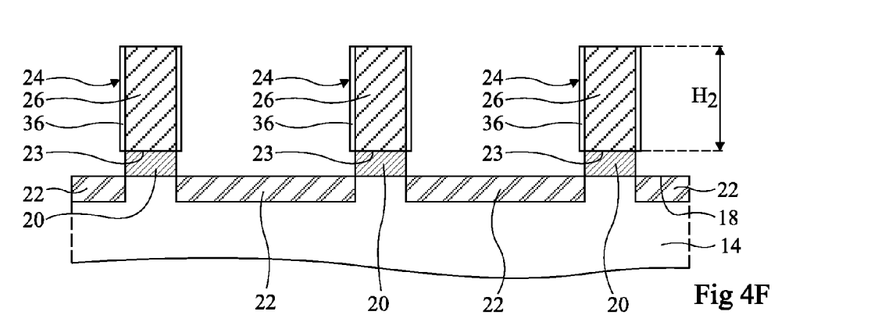

Each microwire or nanowire 24 grows from surface 23 at the top of a seed island 20. The fraction of contact portion 26 of each microwire or nanowire 24 may be obtained by an MOCVD-type method. However, methods such as MBE, GSMBE, MOMBE, ALE, or HVPE may be used.

As an example, in the case where contact portion 26 is made of GaN, an MOCVD-type method may be implemented by injection into an MOCVD reactor of a gallium precursor gas, for example, trimethylgallium (TMG), and of a nitrogen precursor gas, for example, ammonia (NH3). As an example, a 3×2", showerhead-type, MOCVD reactor sold by AIXTRON may be used. A molecular flow ratio between trimethylgallium and ammonia within the 5-100 range, preferably within the 10-20 range, promotes the growth of microwires or nanowires. As an example, gas flows may be approximately 60 sccm (standard cubic centimeters per minute) in TMG and 50 sccm in NH3 and a pressure of approximately 800 mbar (800 hPa) is used. The gas mixture further comprises the injection into the MOCVD reactor of silane, which is a silicon precursor material. Silane may be diluted in hydrogen at 100 ppm and a molar flow of approximately 400 ml per minute is introduced. The temperature in the reactor for example ranges between 950° C. and 1,100° C., preferably between 990° C. and 1,100° C., preferably still between 1,015° C. and 1,060° C. The pressure in the reactor for example is approximately 800 mbar (800 hPa). A carrier gas may be used, for example, nitrogen, for example with a 1,000 sccm flow for TMG and a 1,000 sccm flow for NH3.

The presence of silane among the precursor gases causes the incorporation of silicon within the III-N compound. Further, this results in the forming of silicon nitride layer 36, which covers the periphery of contact portion 26 of height H2 of each nanowire 24, except for the top, along the growth of contact portion 26.

Figure 4G:
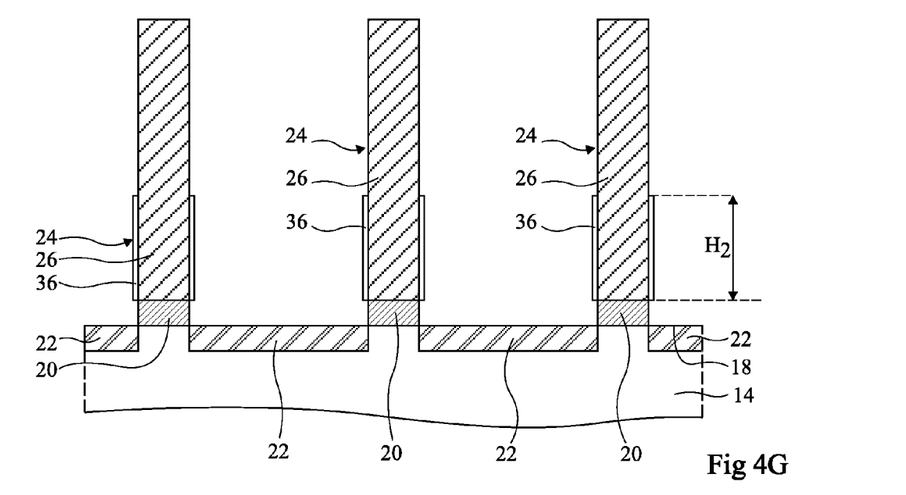

(7) Growth of the remaining fraction of contact portion 26 of each microwire or nanowire 24 (FIG. 4G). As an example, the previously described operating conditions of the MOCVD are maintained, except for the fact that the silane flow in the reactor is decreased, for example by a factor 10, or stopped.

Figure 4H:
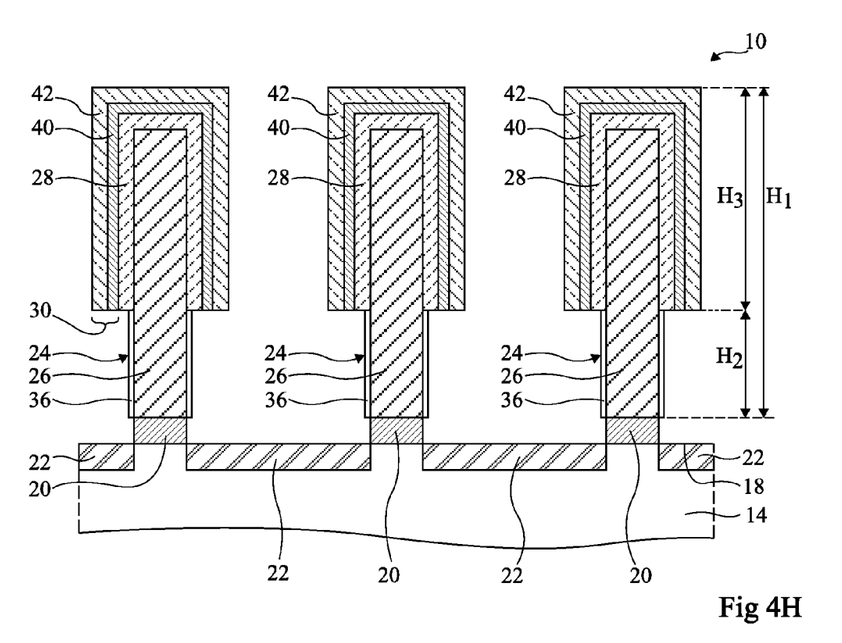

(8) Forming by epitaxy, for each microwire or nanowire 24, of active portion 28 and of polarization portion 30 (FIG. 4H).

Figure 4I:
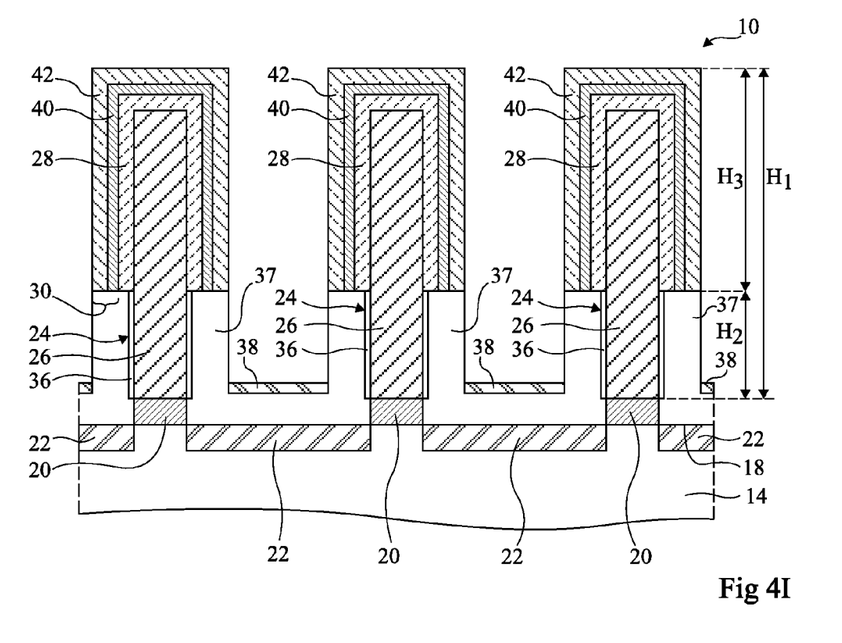

(9) Forming of insulating portions 37 and of reflective portions 38 (FIG. 4I). Insulating portions 37 may be formed by the conformal deposition of an insulating layer over the entire structure shown in FIG. 4H, the non-conformal deposition of reflective portions 38, the deposition of a resin layer between microwires or nanowires 24 and on the periphery of microwires or nanowires 24 up to height H2, the etching of the insulating layer, not covered by the resin, to expose layer 42, and the removal of the resin.

The method comprises additional steps of forming, for each microwire or nanowire 24, of electrodes 12 and 39.

Figure 5A:
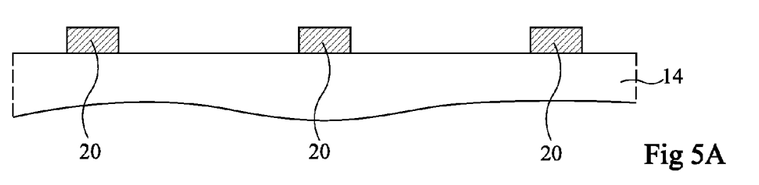
FIGS. 5A and 5B are partial simplified cross-section views of the structures obtained at successive steps of another embodiment of a method for manufacturing the optoelectric device of FIG. 3.
Figure 5B:
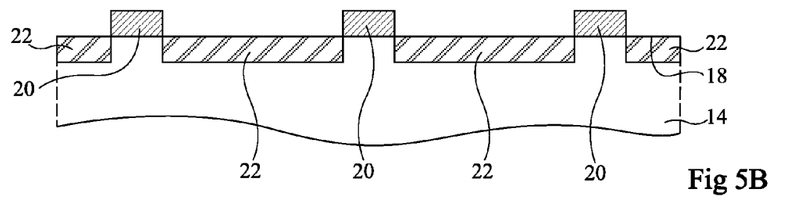

FIGS. 5A and 5B illustrate steps (4)' and (5)' of another embodiment of a method for manufacturing microwires or nanowires and replace steps (4) and (5) previously described in relation with FIGS. 4D and 4E in the method embodiment previously described in relation with FIGS. 4A to 4I, the other steps (1) to (3) and (6) to (9) being identical to those of the previously-described method, but for the fact that the material of portions 52 is not necessarily a dielectric material which may be selectively etched over the dielectric material forming regions 22. Layer 50 may be made of silicon dioxide, of aluminum nitride, of aluminum (possibly doped with silicon). Steps (4)' and (5)' are the following:

(4)' Removal of insulating portions 52. Such a removal may be performed by wet or dry etching (FIG. 5A).

(5)' Forming of region 22 by a method of nitriding of the exposed areas of substrate 14 (FIG. 5B) which are not covered by islands 20. Region 22 is essentially made of silicon nitride. The obtained silicon nitride depth should be sufficient to prevent any etching of the group-III element, for example, gallium, against the material forming substrate 14. The depth of region 22 may range between 5 nm and 100 nm, and may preferably be greater than or equal to 10 nm. Region 22 may partly extend under islands 20. The nitriding conditions are selected so that substrate 14 however remains in electric contact with each island 20. Further, an overthickness may appear at the level of region 22. The nitriding step may be performed with ammonia in a dedicated furnace or in an epitaxy reactor. The nitriding temperature may vary from 900 to 1,100° C. and the nitriding time may vary from a few minutes to one hour. The nitriding step is advantageously performed after the removal of insulating portions 52. Indeed, a nitriding of islands 20 promoting the subsequent growth of contact portions 26 of microwires or nanowires 24 is thus obtained. The nitriding step may be carried out in several steps. As an example, the nitriding step may comprise a first nitriding phase performed at a first temperature followed by a second nitriding phase performed at a second temperature different from the first temperature. The first phase favors the nitriding of islands 20 while the second phase favors the nitriding of the portions of substrate 14 which are not covered by islands 20.

As an example, in the case where the islands are made of transition metals selected from among Ti (titanium), V (vanadium), Cr (chromium), Zr (zirconium), Nb (niobium), Mo (molybdenum), Hf (hafnium), Ta (tantalum), the step of nitriding at least a portion of the transition metal islands is carried out to form a nitrided transition metal layer (respectively titanium nitride, vanadium nitride, chromium nitride, zirconium nitride, niobium nitride, molybdenum nitride, hafnium nitride, tantalum nitride, according to the initial deposited transition metal layer) on each island 20 having a surface intended for the growth of nanowire(s) 24. To optimize the growth, the nitrided transition metal layer may have a minimum thickness of 2 nm, and preferably in the range between 2 nm and 50 nm.

According to an embodiment applicable to the different transition metals, especially for Hf, Nb, Ta, the deposited transition metal layer 50 may have a thickness in the range between 20 nm and a few hundreds of nanometers (for example, 200 nm). For the other transition metals, a 20-nm thickness will be preferred. The deposition may be performed by PVD (physical vapor deposition) from a metal target, for example, a sputtering with a D.C. current flowing through the target. During such a transition metal deposition step, substrate 14 may be maintained at ambient temperature. Generally, for the entire description, "ambient temperature" refers to a temperature preferably in the range between 20° C. and 50° C. The pressure in the PVD enclosure during the transition metal deposition may be in the range between 3.10-3 mbar and 6.10-3 mbar.

After different tests, it could be observed that the nanowire growth was promoted by such nucleation islands 20 formed in two steps.

Actually, the nitrided transition metal islands appear to have growth sites having a crystal orientation promoting the growth of microwires or nanowires. Such growth sites are by a greater number and have a better distribution than in prior art, in particular when comparing titanium nitride nucleation islands formed according to the method of the invention with the titanium nitride islands formed in a single step of prior art.

Further, the fact of selecting one of the following transition metals: Ti, V, Cr, Zr, Nb, Mo, Hf, Ta, to form, after the nitriding of said transition metal, nucleation islands 20, enables to combine metal-type electrical conduction characteristics and the refractory character of a ceramic. Such apparently antagonistic properties may be achieved by the above-mentioned transition metals. In fact, the refractory character may be obtained by a material having a melting point associated with a temperature greater than approximately 1,800° C., which is the case for the nitride of the above-targeted transition metals. Although it is present in the same column as chromium and molybdenum, tungsten is discarded from the list since tungsten nitride has an insufficient stability at high temperatures, which does not allow an efficient nanowire growth.

As a result of the foregoing, the crystal orientation of nucleation islands 20, in particular at the level of a surface intended for the nanowire growth, is important in the context where nanowire growth is desired to be promoted. Thus, the step of depositing the transition metal layer 50 is preferably carried out so that said transition metal layer 50 at least partly has, before the nitriding step, a centered face cubic crystal structure (CC) or a hexagonal crystal structure (these two crystal structures are those of the above-mentioned metals).

In the present description, when speaking of the predominance of a crystal structure, this means that the latter is proportionally larger than each of the other crystal structures taken independently.

Typically, for the above-targeted transition metals, the centered face cubic structure (CC) can be naturally obtained by deposition of a layer of a transition metal selected from among Cr, Mo, V, Nb, Ta, and the hexagonal structure may be naturally obtained by deposition of a transition metal layer selected from among Ti, Zr, Hf.

The above-targeted specific crystal structures enable to carry out the step of nitriding said transition metal islands or at least a portion of the transition metal islands, to at least partly modify the crystal structure of the transition metal islands into a centered face cubic structure, in particular, oriented in the [111] direction, or a hexagonal structure, in particular, oriented in the [0001] direction, or along the direction of axis 'C', associated with the nitrided transition metal islands.

Figure 6:
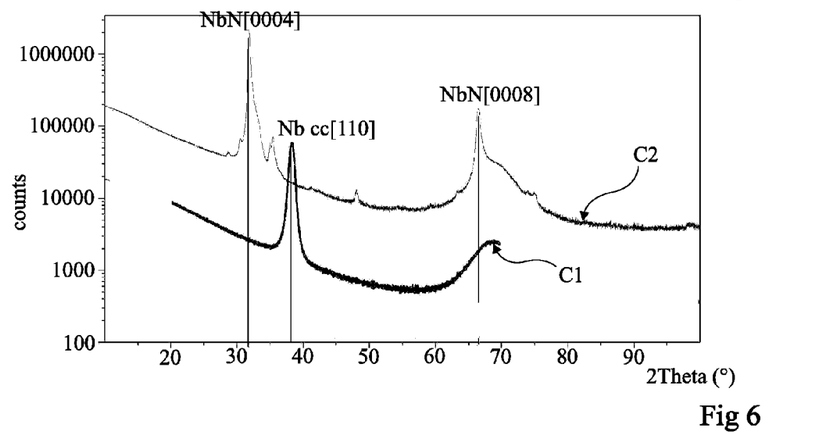
FIG. 6 shows a X-ray diffraction diagram that allows the types of crystallographic structures present in a transition metal layer based on Nb before nitriding and after nitriding to be identified.
Figure 7:
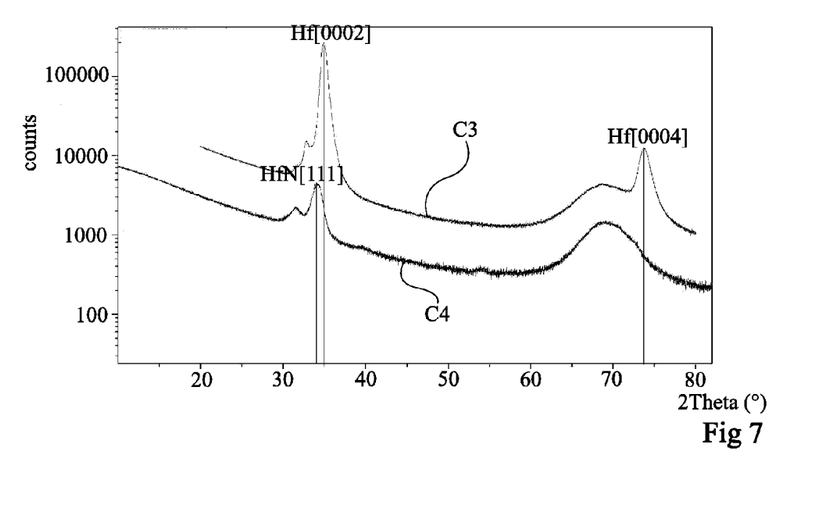
FIG. 7 shows a X-ray diffraction diagram that allows the types of crystallographic structures present in a transition metal layer based on Hf before nitriding and after nitriding to be identified.

FIGS. 6 and 7 each illustrate an X-ray diffraction spectrum enabling to identify the crystal phases or structures present. FIG. 6 shows that for curve C1 representative of the crystal structure of the transition metal layer of type Nb before nitriding, the [110] orientation of the centered face cubic structure (CC) of Nb, is effectively predominating and that for curve C2 representative of the hexagonal crystal structure of nitrided transition metal layer NbN, the [0004] orientation of the hexagonal structure and its orientation harmonic [0008], that is, an orientation similar to [0001], is effectively predominating. FIG. 7 shows that for curve C3 representative of the hexagonal crystal structure of the transition metal layer of type Hf before nitriding, the orientation of the hexagonal structure is effectively predominating, and that, for curve C4 representative of the centered face cubic structure of the nitrided transition metal layer, HfN, the [111] orientation of the centered face cubic structure is effectively predominating. In FIGS. 6 and 7, only the peaks are important to visualize the predominance, the rest of the curve representing a continuous background due to the experimental device and to the sample. Similar curves can be plotted for the other transition metals by those skilled in the art, who would come to substantially identical conclusions, for example, for tantalum nitride, there would be a predominance of the [111] orientation of the centered face cubic structure of tantalum nitride.

Figure 8:
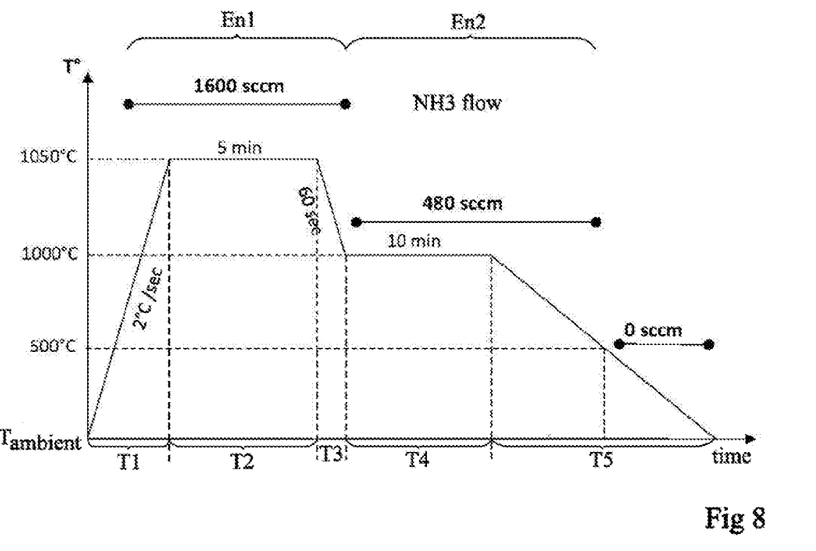
FIGS. 8 and 9 show in detail embodiments of a nitriding step.

According to a specific embodiment, in particular illustrated in FIG. 8, the nitriding step may comprise a first nitriding sub-step En1 carried out at least partly at a first temperature by imposing an injection of a nitriding gas with a first flow rate, and a second nitriding sub-step En2 at least partly carried out at a second temperature lower than or equal to the first temperature by imposing an injection of the nitriding gas with a second flow rate which may be different from the first flow rate, preferentially different from the first flow rate. This enables to optimize the crystal orientation of the nucleation islands. It should be understood that two nitriding/anneal sub-steps are carried out one after the other. In particular, first sub-step En1 enables to perform a fast nitriding (to preferably form the nitrided compound) and second sub-step En2 enables to perform an anneal stabilizing the nitride phase of the transition metal of islands 20 while adjusting the nitriding of the silicon substrate 14 (thickness, composition . . . ). Consecutively to the two sub-steps En1 and En2, the different surfaces of the islands 20 (nucleation layer islands) and the surface between said islands 20 are chemically and thermally stable to respectively allow a growth of the nano- or microwires and to protect the substrate 14 (in particular if the substrate 14 is made of silicon) during the nanowire growth.

Embodiment of FIG. 8 is preferably implemented when the transition metal is Ta.

The injected gas may be ammonia $NH_3$ or dinitrogen $N_2$. $NH_3$ is preferred since it enables to more rapidly nitride the transition metal islands. Indeed, the nitriding capacity is higher in the $NH_3$ form than for $N_2$. Such a fast nitriding may be important, especially if the transition metal is capable of transforming into silicide, which subject will be discussed hereafter.

According to a specific example, the injected nitriding gas being ammonia, the first temperature is in the range between 1,000° C. and 1,050° C., in particular equal to 1,050° C., the first flow rate is in the range between 500 sccm and 2,500 sccm (sccm is a flow rate unit, "standard cubic centimeters per minute"), in particular equal to 1,600 sccm, the second temperature is in the range between 950° C. and 1,050° C., in particular equal to 1,000° C., the second flow rate is in the range between 500 sccm and 2,500 sccm, in particular equal to 500 sccm.

The above-mentioned flow rates correspond to the volume capacity of the nitriding chamber used, that is, a total gas volume (for example, $N_2+NH_3$) of 8 liters in the mentioned example. For a chamber having a different volume, the flow rates should be adapted (for example: for a 18-liter chamber, the first flow rate should in particular be equal to 4,000 sccm and the second flow rate should in particular be equal to 1,200 sccm). In other words, the first flow rate is in the range between 500*V/8 sccm and 2,500*V/8 sccm, in particular equal to 1,600*V/8 sccm, and the second flow rate is in the range between 500*V/8 sccm and 2,500*V/8 sccm, in particular, equal to 500*V/8 sccm. V is the total capacity in liters of a corresponding nitriding chamber. "Corresponding nitriding chamber" here means the chamber where the transition metal islands are nitrided.

Generally, the nitriding step may be carried out in a nitriding chamber placed at a pressure in the range between 50 mbar and 800 mbar, in particular 100 mbar.

FIG. 8 is a detailed illustration of the nitriding step showing the temperature variation along time in a nitriding chamber. In a first period T1, the temperature in the nitriding chamber progressively increases, for example, by 2° C./s until it reaches a stage 1,050° C. The first above-targeted nitriding step under $NH_3$, En1, starts when the temperature reaches 200° C. During this first sub-step, the $NH_3$ flow rate remains constant at 1,600 sccm. During a second period T2, occurring at least partly concurrently to the first sub-step, the temperature is maintained at 1,050° C. for a time period between 5 minutes and 15 minutes. During a third period T3, first sub-step En1 is continued while the temperature varies from 1,050° C. to 1,000° C. in 60 s. In a fourth period T4, the temperature in the nitriding chamber is maintained at 1,000° C. for a time in the range between 5 minutes and 15 minutes and second sub-step En2 is started. During a fifth period T5, the heat input in the nitriding chamber is stopped so that the temperature of the nitriding chamber decreases back to the ambient temperature. The duration of T5 may correspond to the inertia of the nitriding chamber. Second nitriding sub-step En2 may be continued for a determined time during fifth period T5. Fifth period T5 may correspond to a stopping of the heating of the chamber, followed by a decrease of its temperature, or may also correspond to a nanowire growth step if the chamber used for the nitriding also is the MOCVD chamber dedicated to the nanowire synthesis.

According to a specific embodiment, the steps of growth of nanowire 24 is carried out after second nitriding sub-step En2 or is initiated during second nitriding sub-step En2.

Figure 9:
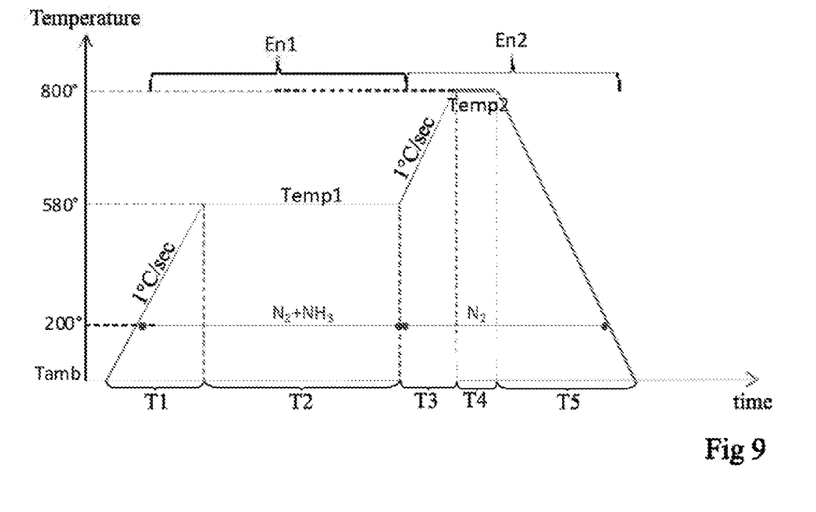

According to a specific embodiment, in particular illustrated in FIG. 9, the nitriding step may comprise a first nitriding sub-step En1 carried out at least partly at a first temperature by imposing an injection of a nitriding gas with a first flow rate, and a second nitriding sub-step En2 at least partly carried out at a second temperature greater than or equal to the first temperature by imposing an injection of the nitriding gas with a second flow rate which may be different from the first flow rate. This enables to optimize the crystal orientation of the nucleation islands. It should be understood that two nitriding/anneal sub-steps are carried out one after the other. In particular, first sub-step En1 enables to perform a fast nitriding (to preferably form the nitrided compound) and second sub-step En2 enables to perform an anneal stabilizing the nitride phase of the transition metal of islands 20 while adjusting the nitriding of the silicon substrate 14 (thickness, composition . . . ). Consecutively to the two sub-steps En1 and En2, the different surfaces of the islands 20 (nucleation layer islands) and the surface between said islands 20 are chemically and thermally stable to respectively allow a growth of the nano- or microwires and to protect the substrate 14 (in particular if the substrate 14 is made of silicon) during the nanowire growth.

Embodiment of FIG. 8 is preferably implemented when the transition metal is Ti, Zr, Hf or Nb.

The injected gas may be ammonia $NH_3$ or dinitrogen $N_2$. $NH_3$ is preferred since it enables to more rapidly nitride the transition metal islands. Indeed, the nitriding capacity is higher in the $NH_3$ form than for $N_2$. Such a fast nitriding may be important, especially if the transition metal is capable of transforming into silicide, which subject will be discussed hereafter.

According to a specific example, the injected nitriding gas being ammonia, the first temperature is in the range between 400° C. and 1,400° C., preferably between 500° C. and 800° C., in particular equal to 600° C. The second temperature is in the range between 400° C. and 1,400° C., preferably between 500° C. and 1,000° C., in particular equal to 800° C.

Generally, the nitriding step may be carried out in a nitriding chamber placed at a pressure in the range between 50 mbar and 800 mbar, in particular 100 mbar.

FIG. 9 is a detailed illustration of the nitriding step showing the temperature variation along time in a nitriding chamber. In a first period T1, the temperature in the nitriding chamber progressively increases, for example, by 1° C./s until it reaches a stage 580° C. The first above-targeted nitriding step under $NH_3$, En1, starts when the temperature reaches 200° C. During this first sub-step, the $NH_3$ flow rate remains constant at 1,200 sccm. During a second period T2, occurring at least partly concurrently to the first sub-step, the temperature is maintained at 580° C. for a time period between 5 minutes and 30 minutes. During a third period T3, the temperature in the nitriding chamber progressively increases, for example, by 1° C./s until it reaches a stage 800° C. In a fourth period T4, the temperature in the nitriding chamber is maintained at 800° C. for a time in the range between 1 minute and 30 minutes and second sub-step En2 is started. During this second sub-step, the $NH_3$ flow rate remains constant at 1,200 sccm. During a fifth period T5, the heat input in the nitriding chamber is stopped so that the temperature of the nitriding chamber decreases back to the ambient temperature. The duration of T5 may correspond to the inertia of the nitriding chamber. Second nitriding sub-step En2 may be continued for a determined time during fifth period T5. Fifth period T5 may correspond to a stopping of the heating of the chamber, followed by a decrease of its temperature, or may also correspond to a nanowire growth step if the chamber used for the nitriding also is the MOCVD chamber dedicated to the nanowire synthesis.

According to a specific embodiment, the steps of growth of nanowire 24 is carried out after second nitriding sub-step En2 or is initiated during second nitriding sub-step En2.

To perform an optimized nanowire growth, it is preferable for the transition metal layer to be only slightly silicided. The siliciding of the transition metal islands 20 may occur, if substrate 14 is based on silicon, according to two cases: during the step of depositing the transition metal layer 50, and/or when the formed transition metal islands are desired to be nitrided to delimit nucleation islands 20.

The first case can be explained as follows. At high temperature (approximately 1,000° C.), the forming of silicided compounds $MSi_2$ is promoted (M being the transition metal used). Among such silicides, only the silicides of transition metal of column V ($VSi_2$, $NbSi_2$, $TaSi_2$), plus the Cr silicide ($CrSi_2$), form crystal phases having hexagonal structures, potentially advantageous (if they are textured along axis c) for the growth of GaN nanowires. However, the mismatch of mesh parameter "a" between the hexagonal phases and GaN (3.19 Å) is so strong, respectively −30%, −36%, −33%, and −25% for VSi2, NbSi2, TaSi2, CrSi2, that the epitaxy of GaN is very unlikely. Typically, mesh parameter "a" for hexagonal compounds $VSi_2$, $NbSi_2$, $TaSi_2$, $CrSi_2$, respectively is: 4.57 Å, 4.97 Å, 4.78 Å, and 4.28 Å. Thus, a sub-family may be formed of the following materials: Ti, V, Cr, Nb, Ta, Mo, that is, metals having a high interdiffusion coefficient with Si, which implies fast growth kinetics of new phase $MSi_2$. As an example, Cr has an interdiffusion coefficient with Si at 850° C. of $1.5*10^{-7}$ cm$^2$/s, that is, a diffusion length of approximately 11.6 µm in 15 minutes, while around 100° C., such a diffusion length decreases to approximately 80 nm in 15 minutes. For the above-mentioned reasons, if the deposited transition metal is selected from among Cr, V, or Ti, it is preferably deposited at a temperature lower than 100° C. to limit the diffusion of silicon from the substrate. For Nb, interdiffusion length Nb—Si for 15 minutes is 12 nm and 2 nm respectively for 800° C. and 700° C. Nb can thus be deposited at high temperature up to 700-750° C. with no, or with a very low, silicidation phenomenon. The other materials: Zr, Hf, and Ta having lower interdiffusion coefficients with Si than Nb can thus easily be deposited from the ambient temperature up to at most 750° C.-800° C. Too much siliciding would result in preventing the subsequent obtaining of a nitrided transition metal layer of sufficient thickness. In other words, to generalize, substrate 14 being made of silicon, the step of depositing the transition metal layer 50 is configured so that the interdiffusion of silicon in the deposited transition metal layer 50 is shorter than 10 nm and/or to keep a non-silicided thickness of the transition metal layer of at least 2 nm. In fact, such a non-silicided thickness is located opposite to the substrate and is intended to form the nitrided layer of the transition metal islands. In FIG. 4A, reference 50 indicates the transition metal layer initially deposited on substrate 14. During the deposition of layer 50, a thickness extending from substrate 14 may have silicided so that only a portion of layer 50 is made of a pure transition metal capable of being used to form, by nitriding, the nucleation islands.

In the second case, the nitriding step may require to work at 1,050° C. for a few minutes. To achieve this, it will be preferred to use NH$_3$ as a nitriding gas since, due to its high nitriding capacity, the nitriding reaction is faster than the siliciding. Actually, ideally, at least one nitrided transition metal layer (that is, the nucleation layer) is desired to be formed during the nitriding step on the transition metal islands 20, the thickness of said nitrided transition metal layer being advantageously in the range between 2 nm and 50 nm. To avoid the obtaining of a new significant silicided compound at the level of this nitrided transition metal layer, the nitriding step will be optimized. In fact, after the nitriding step, it should be understood that each island 20 which is desired to be formed by depositing a transition metal may actually comprise a first silicided transition metal layer, in contact with substrate 14, obtained during the deposition of said transition metal, a second silicided transition metal layer arranged in the continuity of first silicided transition metal layer obtained during the nitriding step, and nucleation layer originating from the nitriding of metal transition island 20. Optionally, there may also remain a residual layer of pure transition metal interposed between nitrited layer and second silicided layer, this being partly dependent on the initially deposited transition metal thickness.

In other cases, such as for example, when the islands are made of aluminum (possibly doped with silicon), the nitriding step may comprise a first nitriding step which may be carried out at a first temperature lower than the second one, for example, in the range between 400 and 750° C., followed by a second nitriding phase carried out at a second temperature strictly greater than the first temperature, for example, in the range between 800 and 1,100° C. As previously described, the first phase promotes the nitriding of islands 20 while the second phase promotes the nitriding of the portions of substrate 14 which are not covered with islands 20.

As appears from the discussion of the various previous cases, if the substrate is made of silicon, it will be within the abilities of those skilled in the art to organize, if necessary, different nitriding steps at different temperatures to optimize each of the different nitriding operations: nitriding of the nucleation islands and nitriding of the substrate to passivate it. On the other hand, it will be within the abilities of those skilled in the art to determine the thickness of the transition metal layer 50 that they intend to deposit according to the type of metal to be deposited (transition metal or not), to its deposition temperature, to its deposition time, as well as the different durations of the nitriding steps to make it possible to obtain a layer of a predetermined thickness of a nitrided metal (transition metal, Al . . . ) and to control the nitride thickness formed in the substrate. In other words, for a silicon-based substrate, the step of depositing the transition metal layer 50 may comprise a prior step of determining the thickness of the transition metal layer to be deposited, said thickness determination step comprising: a step of determining a first silicon diffusion length in the transition metal layer during the future deposition of the transition metal layer according to the transition metal used and to the deposition temperature; a step of determining a second silicon diffusion length in the transition metal islands during the future step of nitriding the transition metal islands and a step of determining the thickness of the nitrided substrate according to these different nitriding steps. Said thickness of the transition metal layer to be deposited being a function of the desired thickness of the nitrided transition metal islands and of a silicided transition metal thickness obtained in the future transition metal islands from the first and second determined diffusion lengths.

Figure 10:
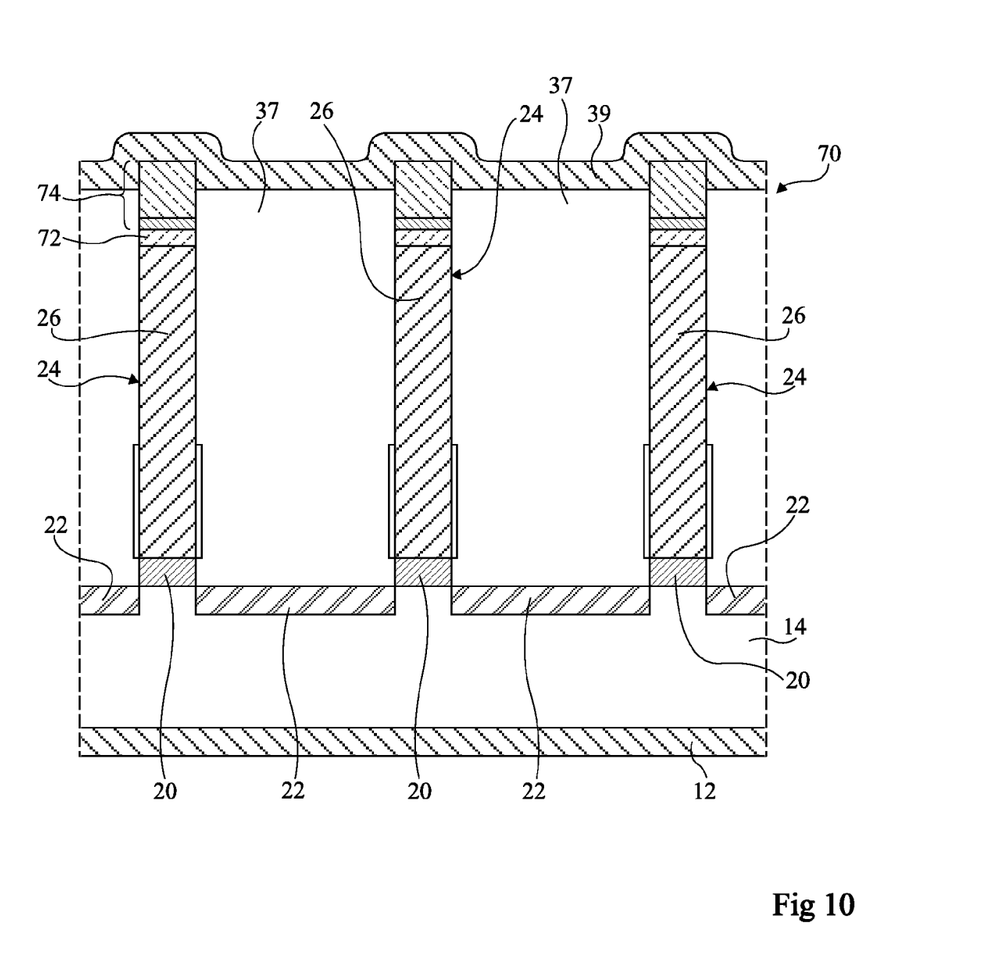
FIG. 10 is a partial simplified cross-section view of another embodiment of an optoelectric device comprising microwires or nanowires.

FIG. 10 is a partial simplified cross-section view of another embodiment of an optoelectric device 70 which is capable of emitting an electromagnetic radiation. Device 70 differs from device 10 by the shape of the active portion and of the polarization portion of each microwire or nanowire 24. Indeed, for each microwire or nanowire 24, active portion 72 only covers the top of microwire or nanowire 24. Active portion 72 may have the same composition as previously described active portion 28. Further, polarization portion 74 covers active portion 72. Polarization portion 74 may have the same composition as previously described polarization portion 30.

Specific embodiments have been described. Various alterations and modifications will occur to those skilled in the art. In particular, although the different previously-described embodiment of optoelectric devices 10 and 70 are capable of emitting an electromagnetic radiation, such devices may easily be adapted by those skilled in the art to receive an electromagnetic radiation and convert it into an electric signal. Such an adaptation is performed both by adapting active portion 28, 72 of each of microwires or nanowires 24 and by applying an adequate polarization to the semiconductor structure.

Such an adaptation of device 10, 70 may be performed to form either an optoelectric device dedicated to measuring or detecting an electromagnetic radiation, or an optoelectric device dedicated to photovoltaic applications.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing an optoelectric device comprising:
   a semiconductor substrate;
   pads on a surface of the substrate;
   semiconductor elements, each element being in contact with a pad; and
   a dielectric region extending in the substrate from said surface and connecting, for each pair of pads, one of the pads in the pair to the other pad in the pair,
   the method successively comprising the forming of the pads and the forming of the region, wherein the region is formed by nitriding of the substrate, the method comprising the successive steps of:
   depositing a layer on the substrate;
   forming portions on the layer;
   etching the parts of the layer which are not covered with the portions to form the pads;
   removing the portions; and
   nitriding the pads and the parts of the substrate which are not covered with the pads, wherein the nitriding step successively comprises:
      a first step of nitriding of the pads at a first temperature; and
      a second step of nitriding of the parts of the substrate which are not covered with the pads at a second temperature different from the first temperature.

2. The method of claim 1, wherein the second temperature is strictly greater than the first temperature.

3. The method of claim 1, wherein the second temperature is strictly lower than the first temperature.

4. The method of claim 1, wherein the substrate comprises a first semiconductor material selected from the group comprising silicon, germanium, silicon carbide, a III-V compound, a II-VI compound, and a combination of these compounds.

5. The method of claim 4, wherein the first semiconductor material is silicon.

6. The method of claim 4, wherein each element comprises at least one portion mainly comprising a second semiconductor material in contact with one of the pads, the second semiconductor material being selected from the group comprising silicon, germanium, silicon carbide, a III-V compound, a II-VI compound, and a combination of these compounds.

7. The method of claim 6, wherein the second semiconductor material is a III-V compound.

8. The method of claim 6, wherein the second semiconductor material is a III-V compound based on a first group-III element and on a second group-V element and wherein each pad comprises a material promoting the growth of the compound according to the polarity of the second element selected form the group comprising aluminum nitride (AlN), boron (B), boron nitride (BN), titanium (Ti), titanium nitride (TiN), tantalum (Ta), tantalum nitride (TaN), hafnium (Hf), hafnium nitride (HfN), niobium (Nb), niobium nitride (NbN), zirconium (Zr), zirconium borate ($ZrB_2$), zirconium nitride (ZrN), silicon carbide (SiC), tantalum carbonitride (TaCN), magnesium nitride ($Mg_xN_y$), magnesium gallium nitride (MgGaN), tungsten (W), tungsten nitride (WN), platinum (Pt), platinum nitride (PtN), and a combination thereof.

9. The method of claim 6, wherein the second semiconductor material is a III-N compound.

10. The method of claim 1, wherein said region is made of a nitride of the semiconductor material forming the substrate.

11. The method of claim 1, wherein the thickness of each pad ranges between 1 nm and 100 nm.

12. The method of claim 1, wherein the depth of the region ranges between 5 nm and 100 nm.

13. The method of claim 1, wherein the substrate corresponds to a semiconductor layer covering a support.

14. The method of claim 13, wherein the support is made of metal.

15. The method of claim 13, wherein the support is made of glass.

16. The method of claim 1, wherein the semiconductor substrate is in contact with each pad.

17. The method of claim 1, wherein at least one of the elements is a microwire or a nanowire.

18. The method of claim 1, wherein at least one of the elements is pyramid-shaped.

* * * * *